US006909295B2

(12) United States Patent
Polonsky et al.

(10) Patent No.: US 6,909,295 B2
(45) Date of Patent: Jun. 21, 2005

(54) ANALYSIS METHODS OF LEAKAGE CURRENT LUMINESCENCE IN CMOS CIRCUITS

(75) Inventors: Stanislav V. Polonsky, Putnam Valley, NY (US); Alan J. Weger, Mohegan Lake, NY (US); Moyra K. Mc Manus, Peekskill, NY (US)

(73) Assignee: International Business Machines Corporation, Armonk, NY (US)

( * ) Notice: Subject to any disclaimer, the term of this patent is extended or adjusted under 35 U.S.C. 154(b) by 93 days.

(21) Appl. No.: 10/669,305

(22) Filed: Sep. 24, 2003

(65) Prior Publication Data

US 2005/0062490 A1 Mar. 24, 2005

(51) Int. Cl.[7] .................. G01R 31/303; H01L 21/00; G06F 19/00
(52) U.S. Cl. .................. 324/750; 438/16; 700/121
(58) Field of Search .................. 324/158.1, 537, 324/750, 752, 753; 700/121; 438/7, 16; 702/57–60, 79

(56) References Cited

PUBLICATIONS

J.A. Kash et al., "Dynamic Internal Testing of CMOS Circuits Using Hot Luminescense", Jul. 1997, IEEE Electron Device Letters, vol. 18, No. 7, pp. 330–332.*

G. Romano et al., "CMOS–Circuit Degradation Analysis Using Measurement of the Substrate Current", May 1997, IEEE Transactions on Electron Device Letters, vol. 44, No. 5, pp. 910–912.*

* cited by examiner

*Primary Examiner*—Evan Pert
(74) *Attorney, Agent, or Firm*—Scully, Scott, Murphy & Presser; Thu. A. Dang

(57) ABSTRACT

Disclosed are a method and system for analyzing leakage current luminescence in CMOS circuits. The method comprises the steps of collecting light emission data from each of a plurality of CMOS circuits, and separating the CMOS circuits into first and second groups. For the first group of CMOS circuits, the emission data from the CMOS circuits are analyzed, based on the presence or absence of leakage light from the CMOS circuits, to identify logic states for the CMOS circuits. For the second group of CMOS circuits, the emission data from the CMOS circuits are analyzed, based on modulation of the intensity of the light from the CMOS circuits, to determine values for given parameters of the circuits. These parameters may be, for example, temperature, cross-talk or power distribution noise.

27 Claims, 6 Drawing Sheets

ANALYSIS METHODS OF LEAKAGE CURRENT LUMINESCENCE IN CMOS CIRCUITS

BACKGROUND OF THE INVENTION

1. Field of the Invention

The present invention relates generally to semiconductor integrated circuit (IC) diagnostics, and, in particular, to methods of non-invasive optical IC diagnostics using light emission from leakage currents in field-effect transistors and MOS capacitors.

2. Background Art

The progress of microelectronics complicates IC diagnostics, making many existing methods obsolete. For example, electrical IC characterization using mechanical probes is difficult and will become more difficult due to shrinking transistor sizes, multiple metal layers, and increasing IC complexity.

Mechanical probing faces the following major problems. First, the access to deep submicron wires requires complex and expensive techniques like Focused Ion Beam (FIB) for probe point creation. More important, the increasing number of metal layers often makes impossible the access to wires deep in the metal stack. Second, the load capacitance and/or resistance of mechanical probes limits the bandwidth of timing measurements.

Third, the proliferation of flip-chip IC packaging makes the access to the front side of an IC impossible, and, consequently, renders this type of probing obsolete.

Another example of electrical IC characterization is e-beam probing. This method provides better spatial and timing resolution while being significantly more expensive. It suffers basically from the same problems as the previous technique: the increasing number of metal layers and the front side inaccessibility.

Photon emission microscopy (PEM) is an alternative method of IC diagnostics. This method uses visible and near infrared photon emission from transistors, pn junctions and similar structures to make conclusions about the operation of an IC. PEM can use time integrating detectors (such as CCD cameras, Focal Plane Arrays, etc.) to obtain the data, as well as time-resolved detectors (such as multichannel plate photomultipliers, single photon avalanche diodes, photomultipliers, etc.). The PEM can be performed both from the front-side and back-side of an IC.

The back-side PEM enjoys increasing interest due to the fact that it circumvents the two major problems of other techniques: multiple metal layers and flip-chip packaging.

Until recently, the only source of light emission from MOSFETs was hot electron radiation from saturated devices. All existing PEM techniques for MOSFETs are based on this type of light emission. As the size of MOSFETs decreases, two types of parasitic leakage currents become increasingly important—gate tunneling current (this type of current is also present in MOS capacitors) and OFF-state drain to source current. Each type of leakage current results in photon emission or, simply, leakage light. In general, the leakage light increases with the increase of leakage current as well as the increase of the voltage difference applied to the device. The leakage light also depends on the device temperature, it increases with the increase of temperature.

The analysis of leakage light may provide valuable insights into optical IC diagnostics. There is, therefore, a need in the art of PEM analysis of ICs for methods to extract information about IC operation from leakage current emission measurements.

SUMMARY OF THE INVENTION

An object of this invention is to provide a method and system of analyzing leakage current luminescence in CMOS circuits.

Another object of the invention is to extract information about IC operations from leakage current emission measurements.

In accordance with a first aspect of the invention, with a method and system are provided for analyzing leakage current luminescence in CMOS circuits. The method comprises the steps of collecting light emission data from each of a plurality of CMOS circuits, and separating the CMOS circuits into first and second groups. For the first group of CMOS circuits, the emission data from the CMOS circuits are analyzed, based on the presence or absence of leakage light from the CMOS circuits, to identify logic states for the CMOS circuits. For the second group of CMOS circuits, the emission data from the CMOS circuits are analyzed, based on modulation of the intensity of the light from the CMOS circuits, to determine values for given parameters of the circuits. For example, the emission data from a CMOS circuit in the first group may be analyzed to determine the logic states of individual switching devices on the circuit or of the whole circuit. Also, the emission data from the second group of circuits may be analyzed to determine the temperature, cross-talk or power distribution noise on those circuits.

In accordance with a second aspect of the invention, methods are provided for using photon emission microscopy to measure the temperature, cross-talk and power distribution noise on CMOS circuits. More specifically, in accordance with this aspect of the invention, a method is provided for measuring the temperature of a CMOS circuit. This method comprises the steps of determining a relationship between the intensity of leakage light from the CMOS circuit and the temperature of the circuit, and using photon emission microscopy to measure photons emitted from the CMOS circuit during a defined time period. This method comprises the further steps of analyzing the photon measurements made by the photon emission microscopy to determine the intensity of light emitted from the CMOS circuit during the defined time period, and comparing said determined intensity with said determined relationship to determine the temperature of the CMOS circuit.

A method is provided of measuring cross-talk noise in a CMOS circuit. This method comprises the steps of determining a relationship between leakage light from the circuit with a given voltage in the circuit, using photon emission microscopy to measure photons emitted from a given area of the CMOS circuit during a defined time period, analyzing the photon emission measurements made using the photon emission microscopy, and comparing the analyzed photon emission measurements with the determined relationship to provide quantitative information about cross talk noise in said given area.

A method is provided for characterizing a power supply noise on a CMOS circuit. This method comprises the steps of providing a set of calibration curves that relate leakage light from the circuit to a given voltage in the circuit, using photon emission microscopy to measure photons emitted from a given area of the circuit during a defined time period, and comparing photon measurements made by the photon emission microscopy with the calibration curves to identify transient variations in said power supply.

Further benefits and advantages of the invention will become apparent from a consideration of the following detailed description, given with reference to the accompanying drawings, which specify and show preferred embodiments of the invention.

DETAILED DESCRIPTION OF THE PREFERRED EMBODIMENTS

Figure 1:
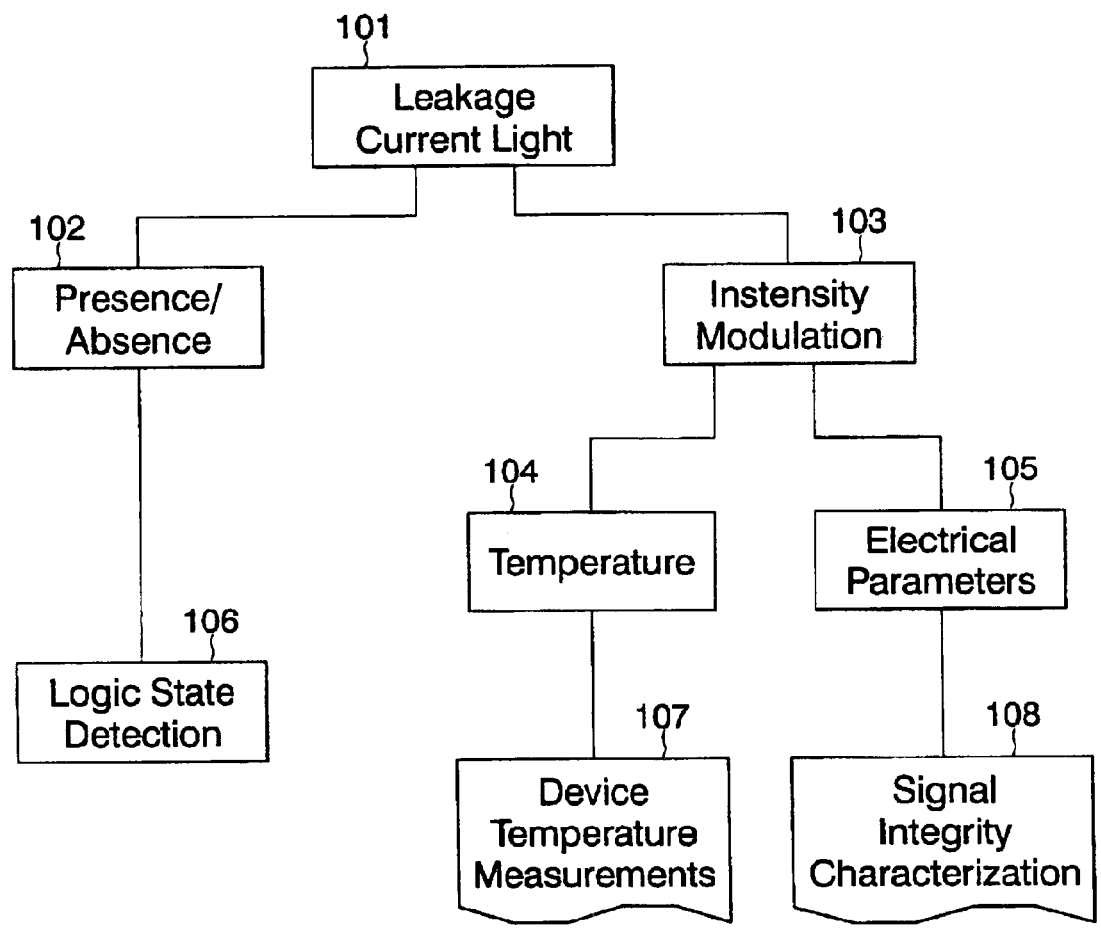
FIG. 1 shows a procedure for classifying the applications of leakage current light analysis.

FIG. 1 is an explanatory diagram classifying the applications of leakage current light analysis 101. There are two major types of applications possible—those, represented at 102, that depend on the presence or absence of leakage current light, and those, represented at 103, that depend on modulation of intensity of leakage light by various parameters. These parameters include the dependence on the device temperature 104 and electrical parameters 105 such as voltage (drain-to-source, gate-to-source, substrate voltage, etc) and current (drain-to-source, gate-to-channel, etc.).

The presence or absence of leakage light from a particular MOSFET allows the detection of its logical state (ON, OFF).

In turn, the knowledge of the logical states of MOSFETs allows the reconstruction of the logical state of an entire IC.

Thus, the logical state of an IC can be determined by measurements of leakage light from MOSFETs.

Figure 2:
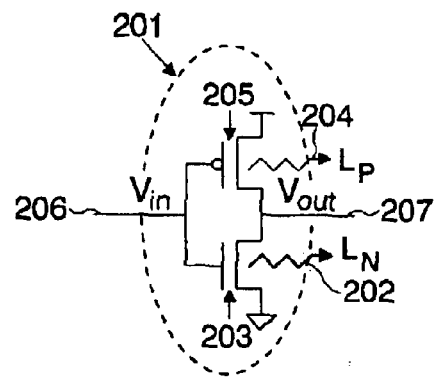
FIG. 2 depicts a semiconductor device and leakage current therefrom.
Figure 3:
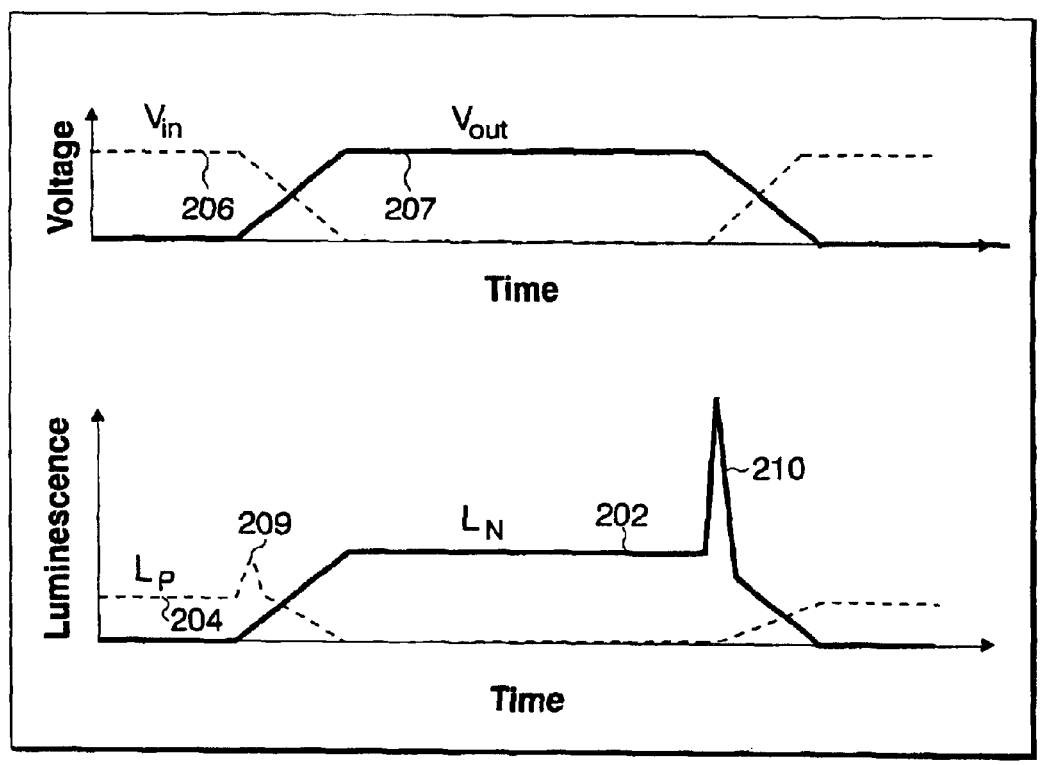
FIG. 3 is a time diagram showing the voltage applied to, and the luminescence levels of leakage light from, the semiconductor device of FIG. 2.

FIG. 2 illustrates this method for CMOS Inverter 201 using OFF-state leakage light. The leakage light 202 from nFET 203 is emitted only when the Inverter is in logic state 1 (i.e. input 206 Vin=0, output 207 Vout=1). The leakage light from pFET is emitted only when the Inverter is in logic state 0 (input 206 Vin=1, output 207 Vout=0). The leakage light emission from both types of devices is persistent (i.e. the devices emit the light as long as the Inverter 201 is in a definite state), unlike the light emitted by MOSFETs in saturation, which is traditionally used by PEM. This type of light emission occurs when the Inverter 201 changes its logical state. On FIG. 3, the peak 209 corresponds to the switching of the pFET, and the peak 210 corresponds to the switching of the nFET.

Similar considerations show that the state of Inverter 201 can be determined using gate tunneling light. Moreover, both types of leakage light can be used to determine the state of an arbitrary CMOS gate.

The Logic State Detection of an IC operating at speed can be performed by measuring leakage light from MOSFETs using a time-resolved detector.

Figure 4:
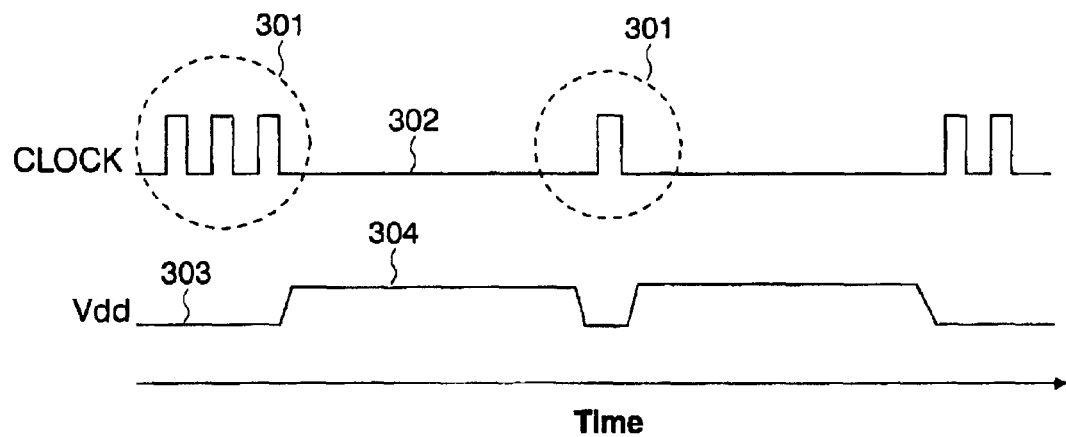
FIG. 4 illustrates logic state detection using time-integrating detectors.

Also, the Logic State Detection of a stopped IC can be performed by using a time-integrating detector as shown on FIG. 4. The clock 301 is applied at nominal speed to an IC until a clock cycle of interest is reached. Then the clock is stopped to keep the logical state of the IC and the image of leakage currents is taken. During this time, the supply voltage Vdd (303) can be raised 304 to increase the intensity of leakage light. After the completion of image acquisition, the clock is applied again until the next clock cycle of interest is reached, another image is taken, etc.

As shown on FIG. 1, the second type of leakage light applications is based on the fact that a number of important parameters can modulate the intensity of that light. Once the dependence of the leakage light on a particular parameter is known, that dependence can be inverted to extract the value of the parameter from the leakage light measurements.

A first important parameter is the device temperature. This fact can be used to determine individual device temperature using the measurements of leakage light emitted by this device.

Figure 5:
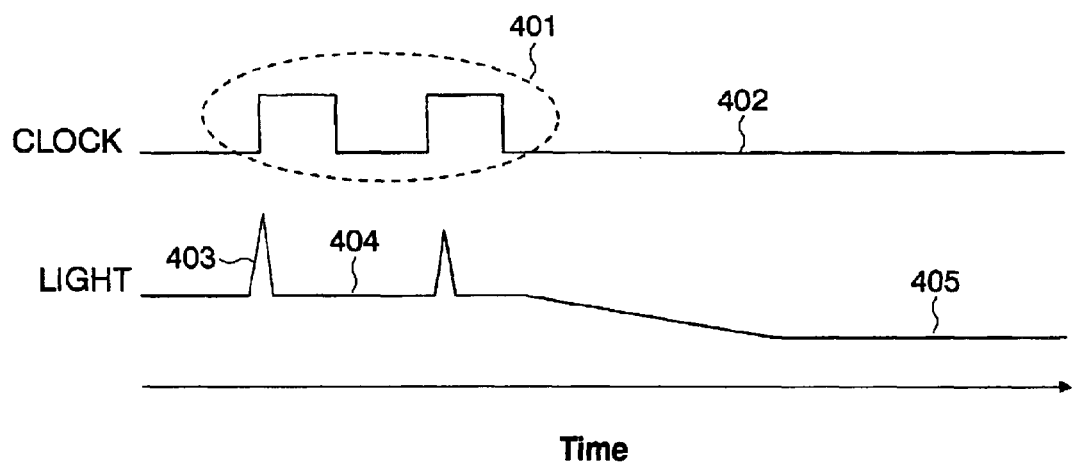
FIG. 5 shows a procedure to determine device temperature using the measurement of leakage light.

FIG. 5 illustrates this method. An IC operates at given clock speed 401. The temperatures of individual devices are increased due to their switching activity. The light emitted by an individual transistor consists of peaks 403 that correspond to its switching activity and "baseline" leakage light 404. Then the clock is stopped at 402. The device temperature decreases and eventually equals ambient temperature, which results in the change of leakage light, as represented at 405 (in this particular example we assume it decreases too). The temperature of the operating device can be extracted using calibration curves that relate the leakage light emission with temperature. The calibration curves can be measured for single devices in a temperature controlled environment.

Alternatively, the time-integrating detector can be used to measure the temperatures distribution among the devices provided that image acquisition begins immediately after the clock is stopped 402 and ends before the leakage lights reach their ambient value 405. In the case when the exposition time is not enough, the procedure of stopping the clock can be repeated.

Various electrical parameters modulate the leakage light. One important application of this fact is the possibility of optical signal integrity analysis (108 on FIG. 1). The issue of signal integrity includes such factors as crosstalk noise, power distribution noise, etc.

Figure 6:
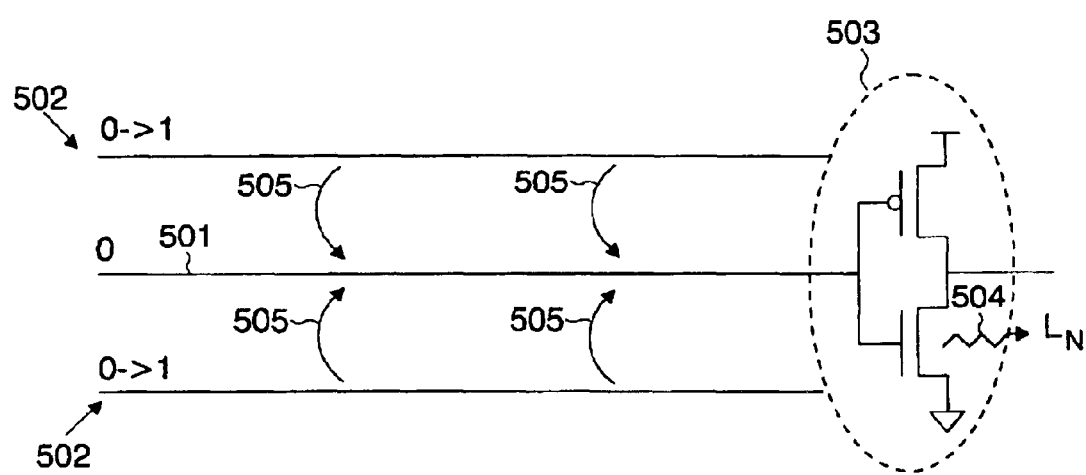
FIG. 6 illustrates a procedure to measure cross-talk noise.

A method to measure crosstalk noise is illustrated on FIG. 6. The "victim" wire 501 is in logical state 0. It is connected to the input of inverter 503 and is coupled to nearby "aggressor" wires 502 through a variety of coupling mechanisms 505 (inductive, capacitive). The leakage light from inverter's nFET is relatively small. The aggressor wires simultaneously transition from logical 0 to 1. The potential of the victim wire 501 increases, which leads to the increase of leakage light 504. The use of calibration curves that relate the leakage light, measured using a time-resolved detector, with the gate-to-source voltage in an nFET, will provide quantitative information about the crosstalk noise in the victim wire.

Time-integrating detectors can also be effectively used for crosstalk noise analysis. Two input patterns are chosen. The first one corresponds to the "minimum" crosstalk (i.e. no transitions in victim and aggressor lines). The second one corresponds to the "maximum" crosstalk (i.e. simultaneous transitions in aggressor lines, no transitions in the victim line). Photon emission images are taken for both patterns and the difference image is computed. The intensity of light emission from the inverter 503 on the difference image is used to detect if there is any significant crosstalk.

Figure 7:
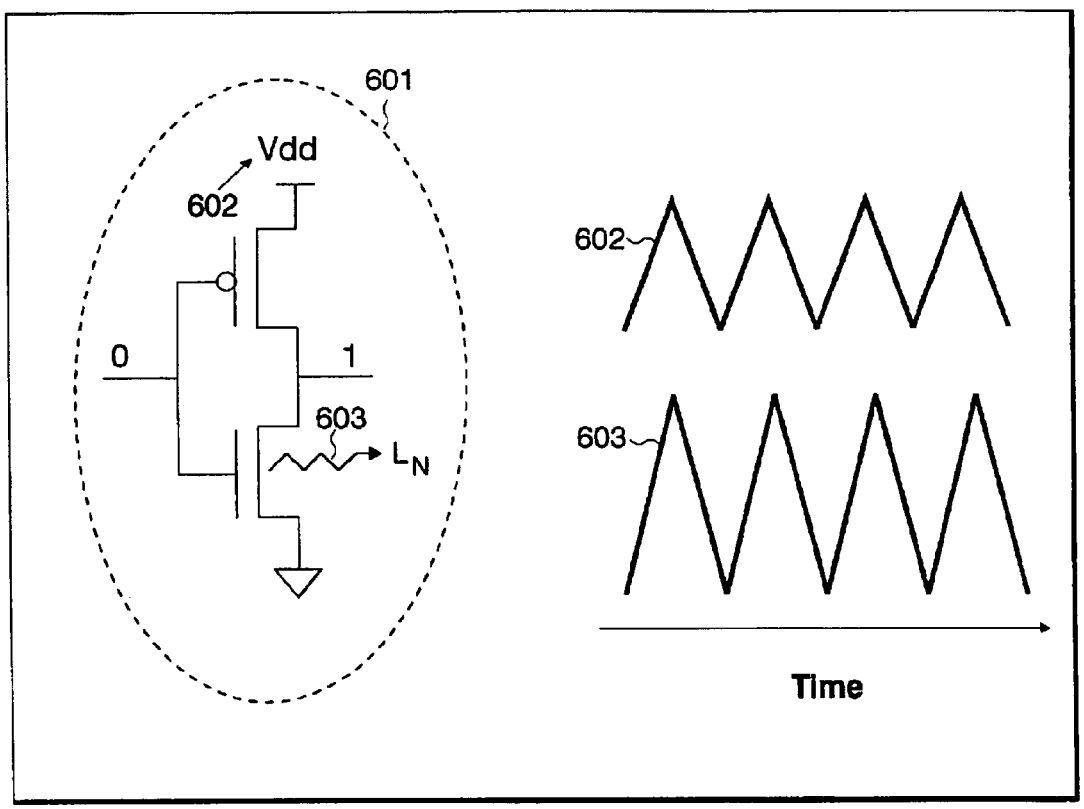
FIG. 7 depicts a method for using leakage light to characterize power distribution noise.

Similarly, the dependence of leakage light in MOSFETs and MOS capacitors on power supply voltage can be used to characterize the power distribution noise. FIG. 7 illustrates the method using OFF-state leakage light from nFET. When the inverter 601 is in logic state 1, the drain-to-source voltage across its nFET is close to power supply voltage Vdd 602. Thus, the leakage light from this nFET 603 is modulated by Vdd. The transient variations of Vdd cause corresponding variations of the leakage light, which, in turn, can be measured by any time-resolved photon detector. The actual voltage waveforms can be extracted from this measurement by using calibration curves. The latter relate leakage light from an individual FET to the drain-to-source voltage, and, possibly, the temperature of the device (which can be measured by the above described method).

Similarly, the power noise analysis can use the leakage light emission from pFETs, gate tunneling light from FETs of any types as well that from MOS capacitors.

Figure 8:
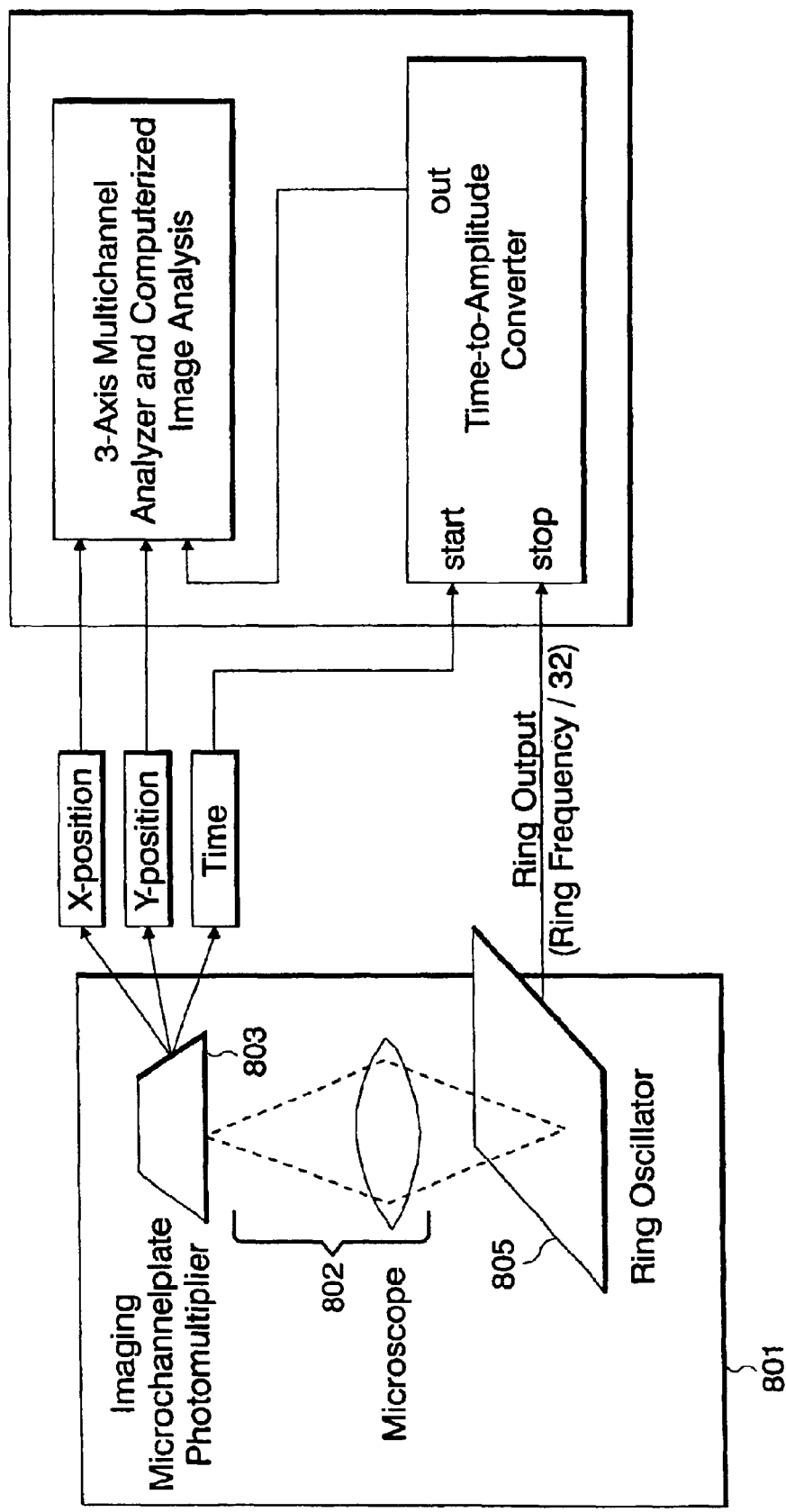
FIG. 8 shows schematically an apparatus that may be used in the practice of this invention.

FIG. 8 shows schematically an apparatus that may be used to obtain time resolved optical images and optical waveforms for use in this invention. The apparatus of FIG. 8 comprises a dark space 801, a microscope 802 having at least its objective disposed in the dark space 801, an imaging optical detector 803 such as an imaging microchannelplate photo multiplier tube, a readout 804 for the imaging detector 803 capable of providing a series of optical images of the emission, each comprising a separate time interval. Alternatively, readout 804 is capable of providing a series of optical waveforms detected by detector 803, where each waveform is obtained from a different portion of the image. A semiconductor integrated circuit to be evaluated 805 is mounted in the dark space at the focus of the microscope objective and powered by a suitable power source. Ideally, detector 803 is capable of counting single photons. For a photon-counting detector, the portion of readout 807 that provides temporal information can be of the type described in the literature as photon timing. Other optical sampling techniques such as up-conversion or a streak camera may also be used.

In a specific implementation of the apparatus of FIG. 8, the imaging optical detector 803 was an imaging microchannelplate photomultiplier tube (MEPSICHRON) available from Quantar Technology Inc. of Santa Cruz, Calif. This type of photomultiplier has been shown to be capable of about 100 psec time resolution. This is far shorter than the time constants of the power supply and the thermal time constant of the chip. The required time constants for these measurements are those of the power supplies and the chips. The readout 804 was a three dimensional multichannel analyzer, which stored information about both the position (x,y) and time (t) for each photon detected. The photons detected over a time interval may be displayed as an image. Each such image shows which devices of circuit 805 are in the process of changing logic states during that time interval.

While it is apparent that the invention herein disclosed is well calculated to fulfill the objects stated above, it will be appreciated that numerous modifications and embodiments may be devised by those skilled in the art, and it is intended that the appended claims cover all such modifications and embodiments as fall within the true spirit and scope of the present invention.

What is claimed is:

1. A method of analyzing leakage current luminescence in CMOS circuits, comprising the steps of:

collecting light emission data from each of a plurality of CMOS circuits;

separating the CMOS circuits into first and second groups;

for the first group of CMOS circuits, analyzing the emission data from the CMOS circuits, based on the presence or absence of leakage light from the CMOS circuits, to identify logic states for the CMOS circuits; and for the second group of CMOS circuits, analyzing the emission data from the CMOS circuits, based on modulation of the intensity of the light from the CMOS circuits, to determine values for given parameters of the circuits.

2. A method according to claim 1, wherein:

each of the CMOS circuits includes a multitude of individual switching devices; and the step of analyzing the emission data from the first group of CMOS circuits includes the step of analyzing emission data from one of the CMOS circuits of said first group to determine the logic states of each of at least some of the switching devices of said one of the CMOS circuits.

3. A method according to claim 2, wherein the step of analyzing the emission data from the first group of CMOS circuits includes the further step of reconstructing the logical state of said one of the CMOS circuits from the determined logic states of said at least some of the switching device.

4. A method according to claim 1, wherein the step of analyzing the emission data from the first group of CMOS circuits includes the step of analyzing the emission data from one of the CMOS circuits of said first group when said one of the CMOS circuits is operating at a defined speed.

5. A method according to claim 1, wherein the step of analyzing the emission data from the first group of CMOS circuits includes the step of analyzing the emission data from one of the CMOS circuits of said first group when said one of the CMOS circuits is stopped.

6. A method according to claim 1, wherein the step of analyzing the emission data from the second group of CMOS circuits includes the steps of, for at least one of the CMOS circuits of said second group, determining a relationship between the given parameter and the intensity of light from the one of the CMOS circuits;

measuring the intensity of light emitted from the one of the CMOS circuits; and comparing said measured intensity with said determined relationship to determine the value for the given parameter on said one of the CMOS circuits.

7. A method according to claim 1, wherein the given parameter is selected from the group comprising temperature, crosstalk noise, and power supply noise.

8. A method according to claim 1, wherein:

each of the CMOS circuits includes a multitude of individual switching devices; and the step of analyzing the emission data from the second group of CMOS circuits includes the step of analyzing the emission data from one of the CMOS circuits of the second group to determine a temperature of one of the individual switching devices of said one of the CMOS circuits.

9. A method according to claim 1, wherein:

each of the CMOS circuits includes a multitude of individual switching devices; and the step of analyzing the emission data from the second group of CMOS circuits includes the step of analyzing emission data from one of the CMOS circuits of the second group to determine a temperature distribution among the switching devices of said one of the CMOS circuits.

10. A system for analyzing leakage current luminescence CMOS circuits, comprising:

means for collecting light emission data from each of a plurality of CMOS circuits;

means for analyzing the emission data from a first group of CMOS circuits, based on the presence or absence of leakage light from the CMOS circuits, to identify logic states for the CMOS circuits of said first group; and means for analyzing the emission data from a second group of CMOS circuits based on modulation of the intensity of the light from the CMOS circuits, to determine values for given parameters of the CMOS circuits of said second group.

11. A system according to claim 10, wherein:

each of the CMOS circuits includes a multitude of individual switching devices; and the means for analyzing the emission data from the first group of CMOS circuits includes means for analyzing emission data from one of the CMOS circuits of said first group to determine the logic states of each of at least some of the switching devices of said one of the CMOS circuits.

12. A system according to claim 11, wherein the means for analyzing the emission data from the first group of CMOS circuits further includes means for reconstructing the logical state of said one of the CMOS circuits from the determined logic states of said at least some of the switching device.

13. A system according to claim 10, wherein the means for analyzing the emission data from the first group of CMOS circuits includes means for analyzing the emission data from one of the CMOS circuits of said first group when said one of the CMOS circuits is operating at a defined speed.

14. A system according to claim 10, wherein the means for analyzing the emission data from the first group of CMOS circuits includes means for analyzing the emission data from one of the CMOS circuits of said first group when said one of the CMOS circuits is stopped.

15. A system according to claim 10, wherein the means for analyzing the emission data from the second group of CMOS circuits includes:

means for determining a relationship between the given parameter and the intensity of light from at least one of the CMOS circuits of the second group;

means for measuring the intensity of light emitted from the one of the CMOS circuits; and means for comparing said measured intensity with said determined relationship to determine the value for the given parameter on said one of the CMOS circuits.

16. A system according to claim 10, wherein the given parameter is selected from the group comprising temperature, crosstalk noise, and power supply noise.

17. A system according to claim 10, wherein:

each of the CMOS circuits includes a multitude of individual switching devices; and the means for analyzing the emission data from the second group of CMOS circuits includes means for analyzing the emission data from one of the CMOS circuits of the second group to determine a temperature of one of the individual switching devices of said one of the CMOS circuits.

18. A system according to claim 10, wherein:

each of the CMOS circuits includes a multitude of individual switching devices; and the means for analyzing the emission data from the second group of CMOS circuits includes means for analyzing emission data from one of the CMOS circuits of the second group to determine a temperature distribution among the switching devices of said one of the CMOS circuits.

19. A program storage device readable by machine, tangibly embodying a program of instructions executable by the machine to perform method steps for analyzing leakage current luminescence in CMOS circuits, said circuits being separated into first and second groups based on light emission data collected from the CMOS circuits, said method steps comprising:

analyzing the emission data from the first group of CMOS circuits based on the presence or absence of leakage light from the CMOS circuits to identify logic states for the CMOS circuits; and analyzing the emission data from the second group of CMOS circuits based on modulation of the intensity of the light from the CMOS circuits to determine values for given parameters of the circuits.

20. A program storage device according to claim 19, wherein:

each of the CMOS circuits includes a multitude of individual switching devices; and the step of analyzing the emission data from the first group of CMOS circuits includes the step of analyzing emission data from one of the CMOS circuits of said first group to determine the logic states of each of at least some of the switching devices of said one of the CMOS circuits.

21. A program storage device according to claim 19, wherein the step of analyzing the emission data from the second group of CMOS circuits includes the steps of, for at least one of the CMOS circuits of said second group, determining a relationship between the given parameter and the intensity of light from the one of the CMOS circuits;

measuring the intensity of light emitted from the one of the CMOS circuits; and comparing said measured intensity with said determined relationship to determine the value for the given parameter on said one of the CMOS circuits.

22. A method of measuring the temperature of a CMOS circuit, comprising the steps of:

determining a relationship between the intensity of leakage light from the CMOS circuit and the temperature of the circuit;

using photon emission microscopy to measure photons emitted from the CMOS circuit during a defined time period;

analyzing the photon measurements made by the photon emission microscopy to determine the intensity of light emitted from the CMOS circuit during the defined time period; and comparing said determined intensity with said determined relationship to determine the temperature of the CMOS circuit.

23. A method according to claim 22, wherein the CMOS circuit includes a multitude of individual switching devices, and the comparing step includes the step of determining the temperature distribution among said devices.

24. A method of measuring cross-talk noise in a CMOS circuit, comprising the steps of:

determining a relationship between leakage light from the circuit with a given voltage in the circuit;

using photon emission microscopy to measure photons emitted from a given area of the CMOS circuit during a defined time period;

analyzing the photon emission measurements made using the photon emission microscopy; and comparing the analyzed photon emission measurements with the determined relationship to provide quantitative information about cross talk noise in said given area.

25. A method according to claim 24, wherein the step of determining a relationship between leakage light from the circuit and a given voltage in the circuit includes the steps of:

obtaining a first photon emission image for a pattern representing a low level of cross talk;

obtaining a second photon emission image for a pattern representing a high level of cross talk; and computing the difference between the first and second photon emission images.

26. A method of characterizing noise from a power supply on a CMOS circuit, comprising the steps of:

providing a set of calibration curves that relate leakage light from the circuit to a given voltage in the circuit;

using photon emission microscopy to measure photons emitted from a given area of the circuit during a defined time period; and comparing photon measurements made by the photon emission microscopy with the calibration curves to identify transient variations in said power supply.

27. A method according to claim 26, wherein:

the power supply applies a drain-to-source voltage to transistors of the circuit; and the step of providing a set of calibration curves includes the step of providing a set of calibration curves that relate leakage light from an individual transistor of the circuit to the drain-to-source voltage applied to said individual transistor.

* * * * *